(12) United States Patent
Steele

(10) Patent No.: US 12,375,073 B1
(45) Date of Patent: Jul. 29, 2025

(54) LOW POWER PHASE INTERPOLATOR WITH DUTY CYCLE CORRECTION

(71) Applicant: Cisco Technology, Inc., San Jose, CA (US)

(72) Inventor: Andrew Steele, Maynard, MA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 18/233,556

(22) Filed: Aug. 14, 2023

Related U.S. Application Data

(60) Provisional application No. 63/398,216, filed on Aug. 15, 2022.

(51) Int. Cl.
*H03K 5/05* (2006.01)
*H03K 5/135* (2006.01)
*H03K 5/156* (2006.01)

(52) U.S. Cl.
CPC .............. *H03K 5/05* (2013.01); *H03K 5/135* (2013.01); *H03K 5/1565* (2013.01)

(58) Field of Classification Search
None
See application file for complete search history.

(56) References Cited

U.S. PATENT DOCUMENTS

| | | | |
|---|---|---|---|
| 9,608,611 B1 * | 3/2017 | Hearne | H03K 5/135 |
| 11,043,948 B1 * | 6/2021 | Lekkala | H03F 3/303 |
| 11,646,742 B1 | 5/2023 | Huang et al. | |
| 11,658,696 B2 * | 5/2023 | Pandita | H03G 3/3042 375/219 |
| 2023/0208411 A1 | 6/2023 | Foley | |

OTHER PUBLICATIONS

Mishra et al., "A 9b-Linear 14GHz Integrating-Mode Phase Interpolator in 5nm FinFET Process", 2022 IEEE International Solid-State Circuits Conference (ISSCC) 2022, pp. 294-296.

* cited by examiner

*Primary Examiner* — Cassandra F Cox
(74) *Attorney, Agent, or Firm* — Patterson + Sheridan, LLP

(57) ABSTRACT

In part, the disclosure relates to a source generating four input clock signals; a phase interpolator (PI) circuit that includes four PI quadrant circuits and a PI bias control circuit, wherein each PI quadrant circuit is configured to: receive, via the source, an input clock signal of the four input clock signals, and generate, based on the input clock signal, a pair of intermediate output clock signals of complementary phases; and a current mode logic (CML) to complementary metal-oxide-semiconductor (CMOS) converter.

19 Claims, 6 Drawing Sheets

LOW POWER PHASE INTERPOLATOR WITH DUTY CYCLE CORRECTION

CROSS REFERENCE TO RELATED APPLICATIONS

This application, which claims priority to and the benefit of U.S. Provisional Application No. 63/398,216, filed on Aug. 15, 2022, the entire disclosure of which is incorporated by reference herein.

FIELD

This disclosure relates generally to the field of digital communication systems such as integrated circuits used in digital communications.

BACKGROUND

Contemporary digital communications systems make extensive use of integrated circuits that are advantageously mass-produced in various configurations for various purposes.

SUMMARY

In part, in one aspect, the disclosure relates to an integrated circuit that generates output clock signals from four input clock signals. In some embodiments, one clock signal has a phase of 0 degrees, another has a phase of 90 degrees, another has a phase of 180 degrees, and another has a phase of 270 degrees.

In some embodiments, output clock signals may be generated from four input clocks using four phase interpolator (PI) quadrant circuits respectively. In some embodiments, each of the four PI quadrant circuits outputs two (e.g., a pair of) output clock signals of complementary phases. In most embodiments the two complementary outputs are generated by a single current source so that each of the four PI quadrant circuits operates in a Class B operation, so that the integrated circuit operates in a Class B operation. These output clock signals (i.e., intermediate output clock signals) may be recombined (e.g., via a Current Mode Logic (CML) to Complementary metal-oxide-semiconductor (CMOS)) to form a single output clock signal (i.e., final output clock signal).

In other embodiments, output clock signals may be generated from four input clocks by eight PI quadrant circuits.

In some embodiments, pairs of output clock signals of complementary phases generated by each of four PI quadrant circuits may be generated using two input clock signals of complementary phases. The arrival of rising and falling edges of the input clocks alternates current between two outputs in a bridge, resulting in a triangle wave with slope set by the capacitance of the load and the bias current through the bridge.

In some embodiments, the four PI quadrant circuits are subject to a bias current that adjusts the phase of the output clock signals in sub-picosecond steps (e.g., by adjusting a phase of an output clock signal in under one picosecond).

In some embodiments, the bias current of the four PI quadrant circuits is adjusted by a binary word input.

In many embodiments, the common mode, i.e. the signal shared in both parts of a differential pair, of each PI quadrant may affect the duty cycle of the output of the PI quadrant. In some embodiments, the common mode of each PI quadrant is set via feedback from the output of the whole PI circuit. Specifically, the common mode of each PI quadrant circuit is set to the DC value of the duty cycle of the final PI circuit output clock signal such that the duty cycles of all the intermediate output clock signals are uniform.

In one embodiment, input clock signals are AC coupled from a driving circuit. The input clock signals may be biased such that the input swing on the current side of an AC coupler may be reduced.

In one embodiment, the input clocks can be capacitively divided down such that the input capacitance seen by the driver circuit can be reduced, thus reducing the overall power requirement of the integrated circuit.

Various embodiments of systems and methods for low power phase interpolation with duty cycle correction are disclosed herein.

In part, the disclosure relates to a source generating four input clock signals; a phase interpolator (PI) circuit that includes four PI quadrant circuits and a PI bias control circuit, wherein each PI quadrant circuit is configured to: receive, via the source, an input clock signal of the four input clock signals, and generate, based on the input clock signal, a pair of intermediate output clock signals of complementary phases; and a current mode logic (CML) to complementary metal-oxide-semiconductor (CMOS) converter.

In some embodiment, the CML to CMOS converter generates, based on respective pairs of intermediate output clock signals received from the four PI quadrant circuits, a final output clock signal. In many embodiments, the PI bias control circuit is configured to apply a bias to one or more of the four PI quadrant circuits to adjust a phase of one or more intermediate output clock signals of the pairs of intermediate output clock signals. In some embodiment, the system may further include a feedback loop linking the final output clock signal to the four PI quadrant circuits.

In various embodiments, the feedback loop causes the final output clock signal to set a common mode for the four PI quadrant circuits, wherein the source is s single current source.

In some embodiments, the feedback loop causes the final output clock signal to correct a duty cycle of at least one intermediate output clock signal of the pairs of intermediate output clock signals. In many embodiments, the feedback loop causes the final output clock signal to correct an inaccuracy in a duty cycle of at least one input clock signal of the four input clock signals.

In some embodiment, the PI bias control circuit is further configured to adjust a phase of one or more of the intermediate output clock signals in one or more sub-picosecond steps. In various embodiments, the PI bias control circuit is further configured to adjust the phase of one or more of the intermediate output clock signals by a binary word input. In some embodiments, each of the four PI quadrant circuits is a class B device.

In part, the disclosure relates to a method for low power phase interpolation with duty cycle correction. The method may include generating four input clock signals for a phase interpolator (PI) circuit in the integrated circuit, wherein the PI circuit comprises four PI quadrant circuits and a PI bias control circuit, wherein the four PI quadrant circuits receive the four input clock signals respectively; generating, for each of the four PI quadrant circuits, based on the respective input clock signal, a pair of intermediate output clock signals of complementary phases; generating, via a current mode logic (CML) to complementary metal-oxide-semiconductor (CMOS) converter in the integrated circuit, using pairs of intermediate output clock signals generated for the four PI quadrant circuits respectively, a final output clock signal; and outputting the final output clock signal.

In some embodiments, the method may further include applying, via the PI bias control circuit, a bias to one or more of the four PI quadrant circuits. In many embodiments, the bias adjusts a phase of one or more intermediate output clock signals of the pairs of intermediate output clock signals in one or more sub-picosecond steps. In various embodiments, the bias adjusts a phase of one or more intermediate output clock signals of the pairs of intermediate output clock signals by a binary word input. In some embodiments, the method may further include setting, using the final output clock signal, a common mode for the four single-phase interpolator circuits. In some embodiments, the method may further include causing, using the final output clock signal and via one or more of the four PI quadrant circuits, a correction of a duty cycle of at least one intermediate output clock signal of the pairs of intermediate output clock signals. In some embodiments, the method may further include causing, using the final output clock signal, a correction of an inaccuracy in a duty cycle of at least one input clock signal of the four input clock signals.

In part, the disclosure relates to a system. The system may include a source generating four input clock signals; a phase interpolator (PI) circuit comprising eight PI quadrant circuits and a PI bias control circuit, wherein each PI quadrant circuit is configured to: receive, via the source, a respective input clock signal of the four input clock signals, and generate, based on the respective input clock signal, a pair of intermediate output clock signals of complementary phases; and a current mode logic (CML) to complementary metal-oxide-semiconductor (CMOS) converter, wherein the CML to CMOS converter generates, based on the pairs of intermediate output clock signals received from the eight PI quadrant circuits, a final output clock signal.

In some embodiments, the CML to CMOS converter generates the final output clock signal by: combining each pair of the pairs of intermediate output clock signals received from the eight PI quadrant circuits to result in four output clock signals; and generating, based on the four output clock signals, the final output clock signal. In many embodiments, the PI bias control applies a bias to one or more of the eight PI quadrant circuits to adjust a phase of one or more of the intermediate output clock signals. In some embodiments, the system further includes a feedback loop linking the final output clock signal to the eight PI quadrant circuits, wherein the feedback loop causes the final output clock signal to correct a duty cycle of one or more of the intermediate output clock signals, wherein the source is a current source. In some embodiments, each of the eight PI quadrant circuits is a class B device.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DETAILED DESCRIPTION

In many embodiments, the current disclosure may enable the design, creation, and/or implementation of a low-power phase interpolator with duty cycle correction. Various devices and components may include an integrated circuit that generates output clock signals from multiple clock signals such as four input clock signals. In some embodiments, an even number of input clock cycles may be used to clock a given device such as a telecom device or a PIC-based device. Output clock signals may be generated from four input clocks using four phase interpolator (PI) quadrant circuits, respectively in some embodiments. In some embodiments, each of the four PI quadrant circuits outputs two (e.g., a pair of) output clock signals of complementary phases.

In most embodiments, the two complementary outputs are generated by a single current source so that each of the four PI quadrant circuits operates in a Class B operation, so that the integrated circuit operates in a Class B operation. Class A, Class B, Class C, etc. are classifications of the power efficiency of a circuit, historically used to describe amplifier design, with Class B having an improved power efficiency over Class A. In many embodiments, in a circuit operating in a Class B operation, a current will be either pulling or pushing a load, resulting in an improved power efficiency over a Class A operation. In many embodiments, a typical PI circuit operates in a Class A regime and as such bleeds away a fixed current. In some embodiments, a Class A PI circuit may be simpler to design but will generally be 50% less power efficient. These output clock signals (i.e., intermediate output clock signals) may be recombined (e.g., via a Current Mode Logic (CML) to Complementary metal-oxide-semiconductor (CMOS)) to form a single output clock signal (i.e., final output clock signal). In various embodiments, a biasing circuit is included that automatically adjusts the common mode of each PI quadrant to correct the duty cycles of the intermediate output clocks.

Figure 1A:
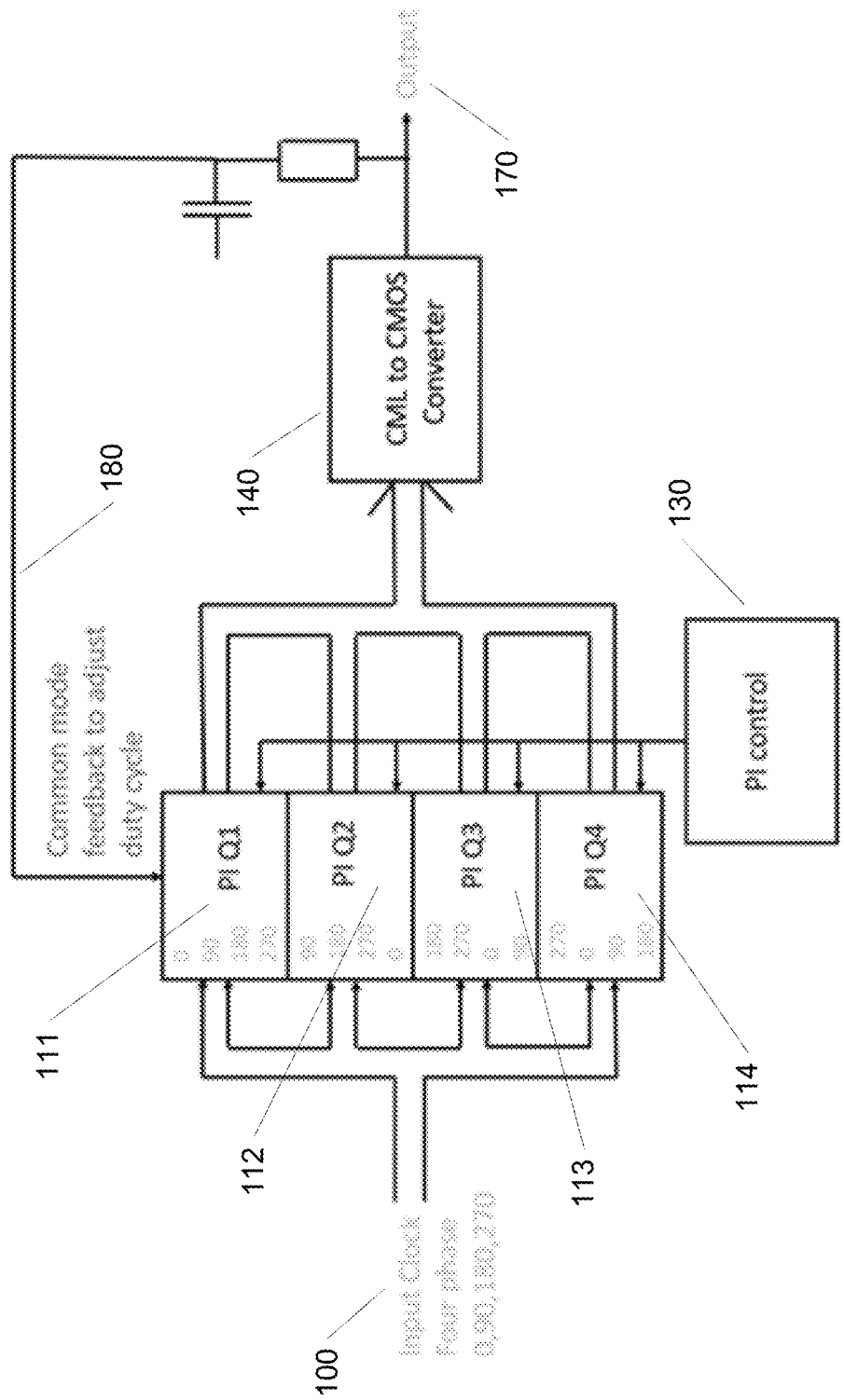
FIG. 1A is a block diagram showing a four-quadrant phase interpolator circuit, according to an exemplary embodiment of the current disclosure.

FIG. 1A is a high-level block diagram showing a four phase interpolator (PI) quadrant circuit, according to an exemplary embodiment of the current disclosure. Specifically, FIG. 1A shows a four PI quadrant circuit where input clocks are distributed among the four PI quadrant circuits, output clocks are generated from the four PI quadrant circuits and a Current Mode Logic (CML) to CMOS conversion, the four PI quadrant circuits are biased to control the phase of the output clock signals, and a common mode of each of the four PI quadrant circuits is set from a feedback from the output clock signals.

As shown in the exemplary embodiment of FIG. 1A, a low power phase interpolator circuit may use four input clock signals 100 to generate an output clock signal 170. In most embodiments, a PI circuit is said to be "low power" because, by nature of its being a Class B device, it may consume half the power of a standard Class A PI. In many embodiments, a Class B PI circuit may consume around 3 mA of operating current under a 900 mV supply. The four input clocks may be equally spaced in phases. For example, if one clock signal has zero phase offset, another clock signal will have a phase of 90 degrees, a third clock will have a phase of 180 degrees, and a fourth clock will have a phase of 270 degrees. In some embodiments, the four input clock signals may be received by the four phase interpolator (PI) quadrant circuits 111-114, respectively.

In various embodiments, the phase of an output clock signal may be shifted in sub-picosecond steps by modifying a binary word that is transformed into a PI bias control 130 for each of the PI quadrant circuits 111-114. In some embodiments, a biasing circuit (e.g., PI bias control circuit 130) may automatically adjust a common mode 180 to correct a duty cycle of output clock signals (e.g., via a feedback loop as shown in FIG. 1A). Also or alternatively, the PI bias control circuit 130 may correct inaccuracies in a duty cycle for one or more of the input clock signals.

In some embodiments, each of four pairs of complementary output clock signals may be recombined into a single output clock 170 by a current-mode logic (CML) to CMOS converter 140. For ease of explanation, the output clock signals (e.g., the pairs of output clock signals) that are output from the PI quadrant circuits may be referred to herein as intermediate output clock signals (e.g., the pair of intermediate output clock signals having complementary phases). When the intermediate output clock signals are recombined, the resulting single output clock 170 may be referred to herein as a final output clock signal.

In many embodiments, the power requirement of the communication system is one significant design consideration. In various embodiments, each PI quadrant circuit may generate a pair of intermediate output clock signals of complementary phases from a single current source, i.e. each PI quadrant circuit operates as a class B device. As such, the entire circuit may operate as a class B device, making the circuit very power efficient.

Furthermore, in various embodiments, input clocks are AC-coupled in from the driving circuit. Due to the biasing of these clocks, the input swing required on the circuit side of the AC coupler may be reduced. The input can be capacitively divided down, reducing the input capacitance seen by the driving circuit, and thereby reducing the overall power of the system.

Figure 1B:
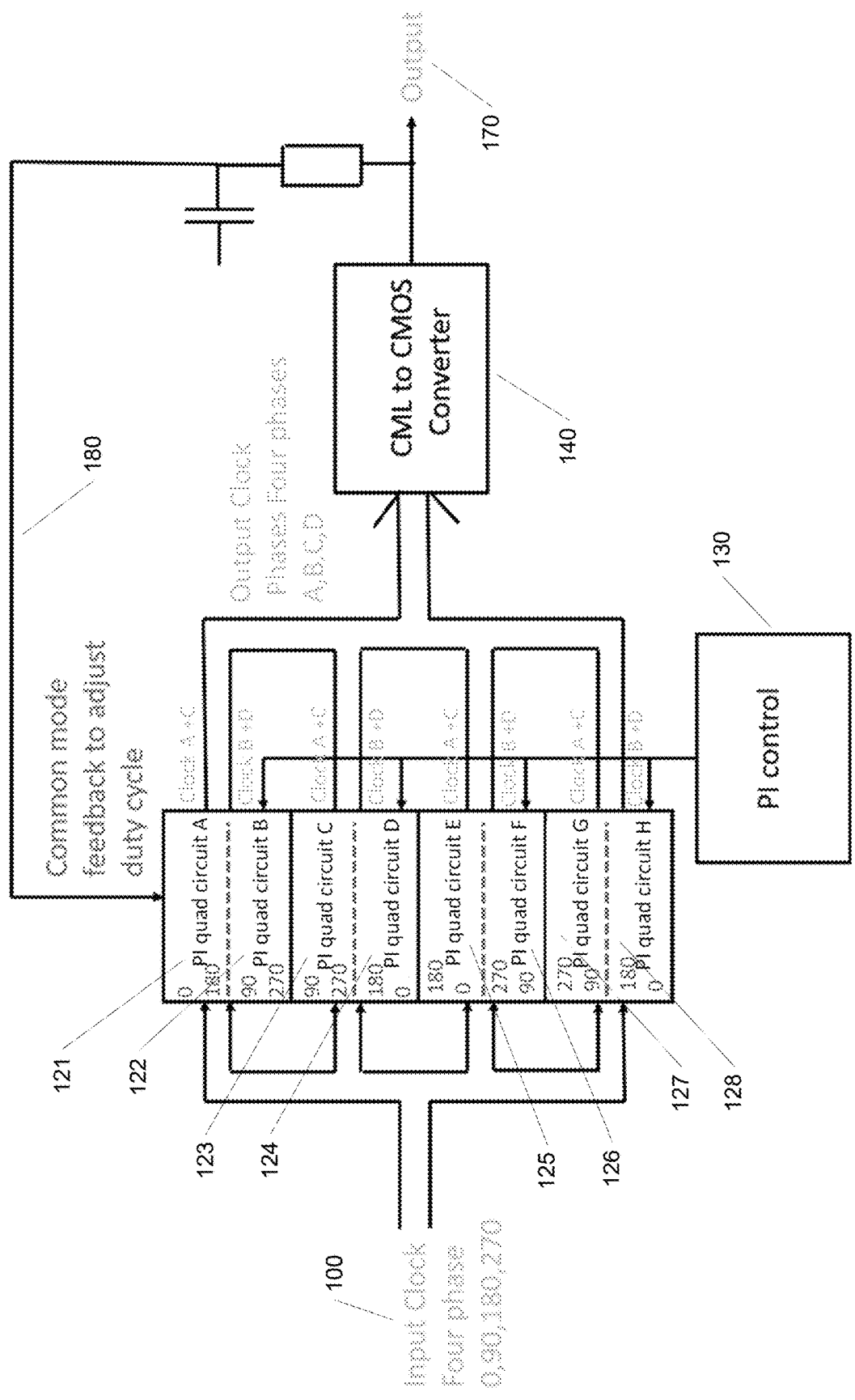
FIG. 1B is a block diagram showing another four-quadrant phase interpolator circuit, according to an exemplary embodiment of the current disclosure.

In the exemplary embodiment of FIG. 1B a block diagram showing another four-quadrant phase interpolator circuit is shown. Moreover, FIG. 1B illustrates an embodiment alternative to the embodiment of FIG. 1A. As shown in FIG. 1B, and unlike FIG. 1A, the four input clock signals may be received by eight PI quadrant circuits 121-128. The exemplary embodiment of FIG. 1A is a single PI with 4 inputs but only 2 outputs. The exemplary embodiment of FIG. 1B produces four outputs, a more standard configuration, using two PI quadrant circuits per quadrant.

In various embodiments, for example the embodiments of FIG. 1A or FIG. 1B, bias applied to each of the four PI quadrants may affect phase rotation of the output clocks. In the example embodiment of FIG. 1B, eight PI quadrant circuits are denoted as Quadrant A, Quadrant B, Quadrant C, etc.; output clocks are denoted as Clock A, Clock B, Clock C, and Clock D. In certain embodiments, combinations of intermediate output clock signals may be referred to as, for example Clock A+B or Clock C+D. Output clocks are generated in pairs, as differential signals, i.e. the differential pair Clock A+B may be treated as two single-ended outputs, one carrying Clock A and the other carrying Clock B.

In many embodiments, when Quadrants A and B are fully biased and all other Quadrants are unbiased, output clocks receive no phase rotation. In this case, input clock signals at phases of 0 and 180 degrees result in the intermediate output clock signal Clock A+B, and input clock signals at phases of 90 and 270 degrees result in the intermediate output clock signal Clock B+D. In many embodiments, when Quadrants A, B, C, and D are half-biased and all other quadrants are unbiased, Clock A+C will be an interpolated clock, where Clock A has a phase of 45 degrees, where Clock C has a phase of 225 degrees; Clock B+D will also be an interpolated clock, where Clock B has a phase of 135 degrees, and Clock D has a phase of 315 degrees. In many embodiments, when Quadrants C and D are fully biased and all other Quadrants are unbiased, Clock A+C will be rotated in phase such that Clock A has a phase of 90 degrees and Clock C has a phase of 270 degrees, and Clock B+D will be rotated in phase such that Clock B has phase of 180 degrees and Clock D has phase of 0 degrees.

Figure 2:
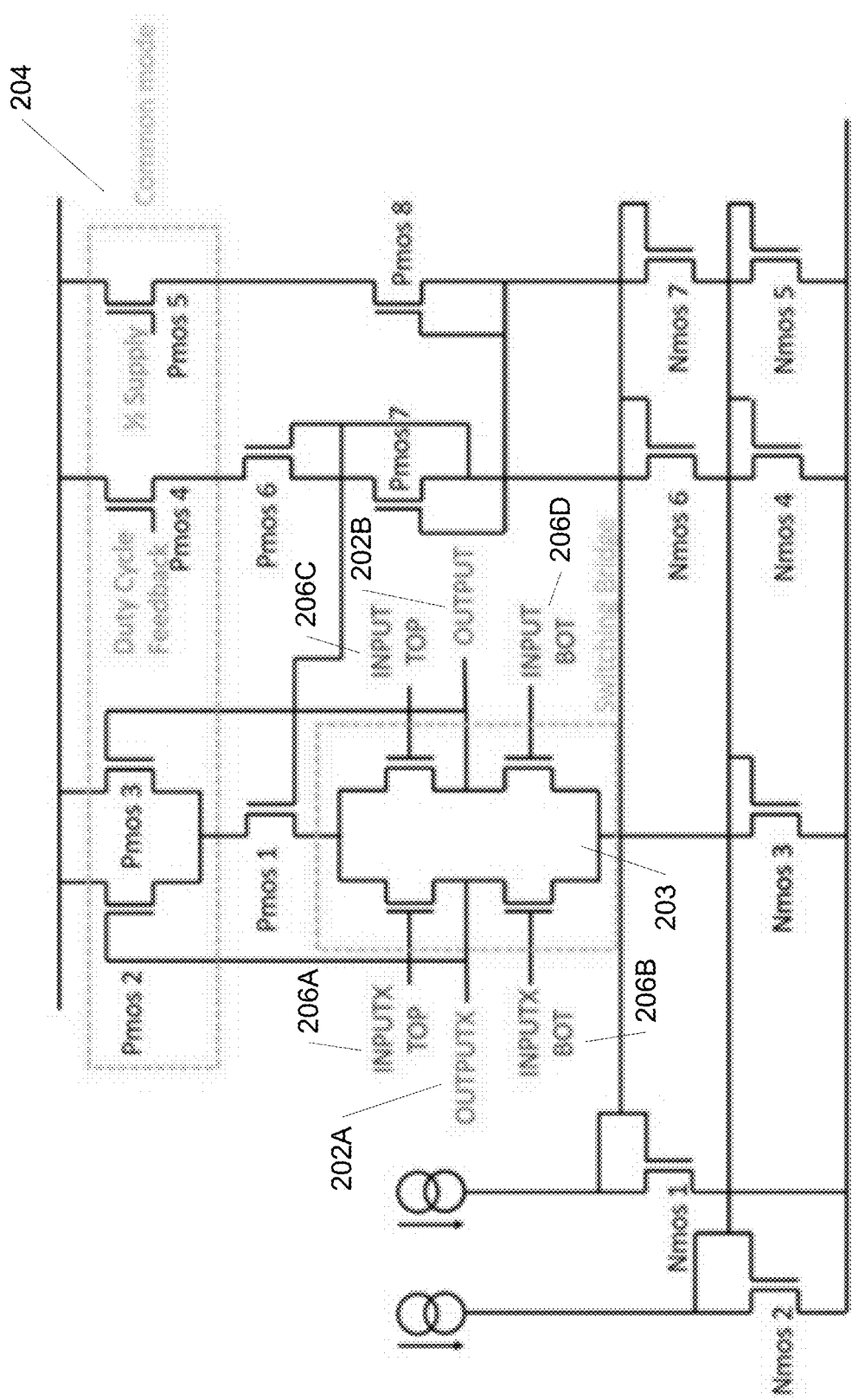
FIG. 2 is a diagram showing a transistor level implementation of a four-quadrant phase interpolator circuit, according to an exemplary embodiment of the current disclosure.

As shown in the exemplary embodiment of FIG. 2, a diagram shows a transistor level implementation of a four-quadrant phase interpolator circuit. Specifically, FIG. 2 illustrates a transistor-level (e.g., a CMOS-level) diagram of a PI quadrant circuit, where two (e.g., a pair of) output clock signals 202A-202B of complementary phase are generated by a single current source in a switching bridge 203, where four input clock signals 206A-206D are coupled, and where the common mode is set from a feedback from the output clock signals. As shown in FIG. 2, a PI quadrant circuit may generate complementary output clock signals 'OUTPUT' 202B and 'OUTPUTX' 202A from a single current source by steering the single current between the two outputs in a bridge fashion.

In many embodiments, for example, as shown in FIG. 2, complementary input clocks, e.g. 'INPUT' 206C-206D and 'INPUTX' 206A-206B, may set a bridge to an initial position. When a rising or falling edge of a clock arrives, current may be switched to the opposite side of the bridge. This switching of current between opposite halves of the bridge may generate a triangular output waveform where an edge rate may be set by a capacitance of a load and a bias current through the switching bridge.

In various embodiments, for example, the embodiment shown in FIG. 2, a common mode for output clock signals may be set by a feedback into the gate of 'PMOS 4' a DC value of an output duty cycle (e.g., a DC value that maps to the duty cycle of the output clock signals). In some embodiments, for example the embodiment shown in FIG. 2, a PI quadrant circuit may adjust a common mode such that a DC value at an output clock signal after a current-mode logic (CML) to CMOS stage (i.e., a final output clock signal) may be regulated to half supply. In certain embodiments, for example, the embodiment shown in FIG. 2, a half-supply voltage may be applied to a gate of 'PMOS 5' to set a balance point for the integrated circuit. In most embodiments, by generating output clock signals at both 0 and 180 degree phases from a single circuit any duty cycle errors in the generation of the CMOS output may be corrected for. Such correction is possible, because the error may be reflected in both 0 and 180 degree phases, and may be corrected for in the circuit (e.g., via a feedback from the final output clock signal).

In various embodiments, a phase interpolator (PI) control may allow one or more PI quadrant circuits to control the phase of an output clock. For example, in some embodiments, quadrant 1 may provide an output clock signal at a phase of 0 degrees. In another embodiment, quadrant 2 may provide an output clock signal at a phase of 90 degrees. In certain embodiments, a PI control circuit may allow multiple quadrants to mix clock signals to obtain values between quadrants. For example, in some embodiments, a combination of quadrant 1 and quadrant 2 may provide an output clock signal at a phase between 0 and 90 degrees. In various embodiments, a PI control circuit may individually send a bias current to each PI quadrant circuit to control whether each PI quadrant circuit is operational or active. In most embodiments, a PI may generate and/or interpolate any clock signals from four reference points (i.e., 0, 90, 180, and 270 degrees).

Figure 3:
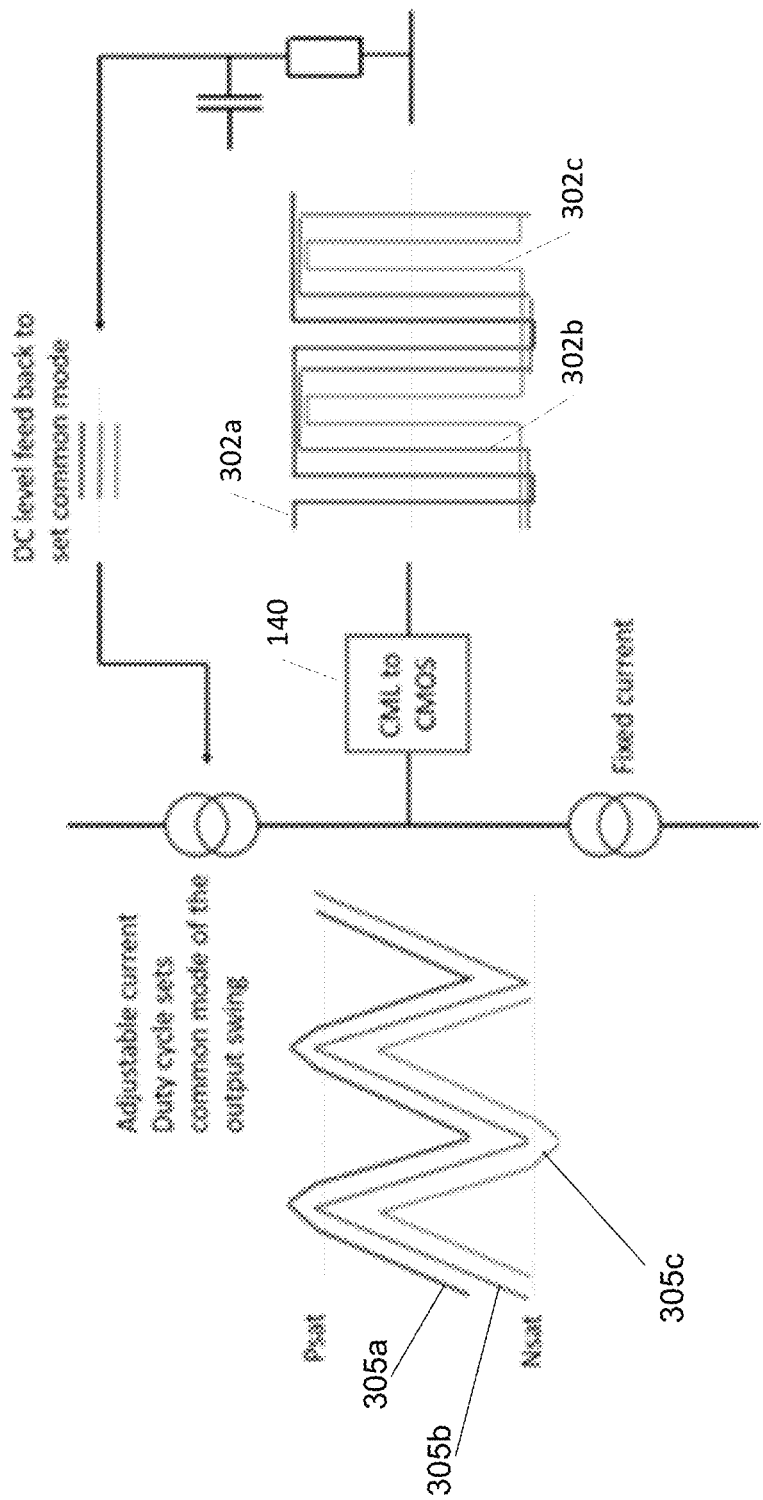
FIG. 3 is a diagram showing waveforms generated by a four-quadrant phase interpolator circuit, according to an exemplary embodiment of the current disclosure.

As shown in the exemplary embodiment of FIG. 3, a diagram shows waveforms 305*a*, 305*b*, and 305*c* generated by a PI circuit comprising four PI quadrant circuits. In various embodiments, a PI may utilize square wave input clock signals 302*a*, 302*b*, and 302*c* for efficient operation. Signal 302*a* is a transform of signal 305*a*, signal 302*b* is a transform of signal 305*b*, and signal 302*c* is a transform of signal 305*c*. Therefore, a PI may be easily integrated into CMOS digital circuits. In certain implementations, as input clock signals may only need to be big enough to turn on devices, i.e. input signals may be between about 200 to 300 mV, input AC capacitors may therefore be scaled to allow some capacitive division of an input signal. In some embodiments, as a CMOS signal is 2 to 3 times larger than that required to switch a device, an external driving circuit may detect a smaller capacitive load, thereby saving power.

Figure 4:
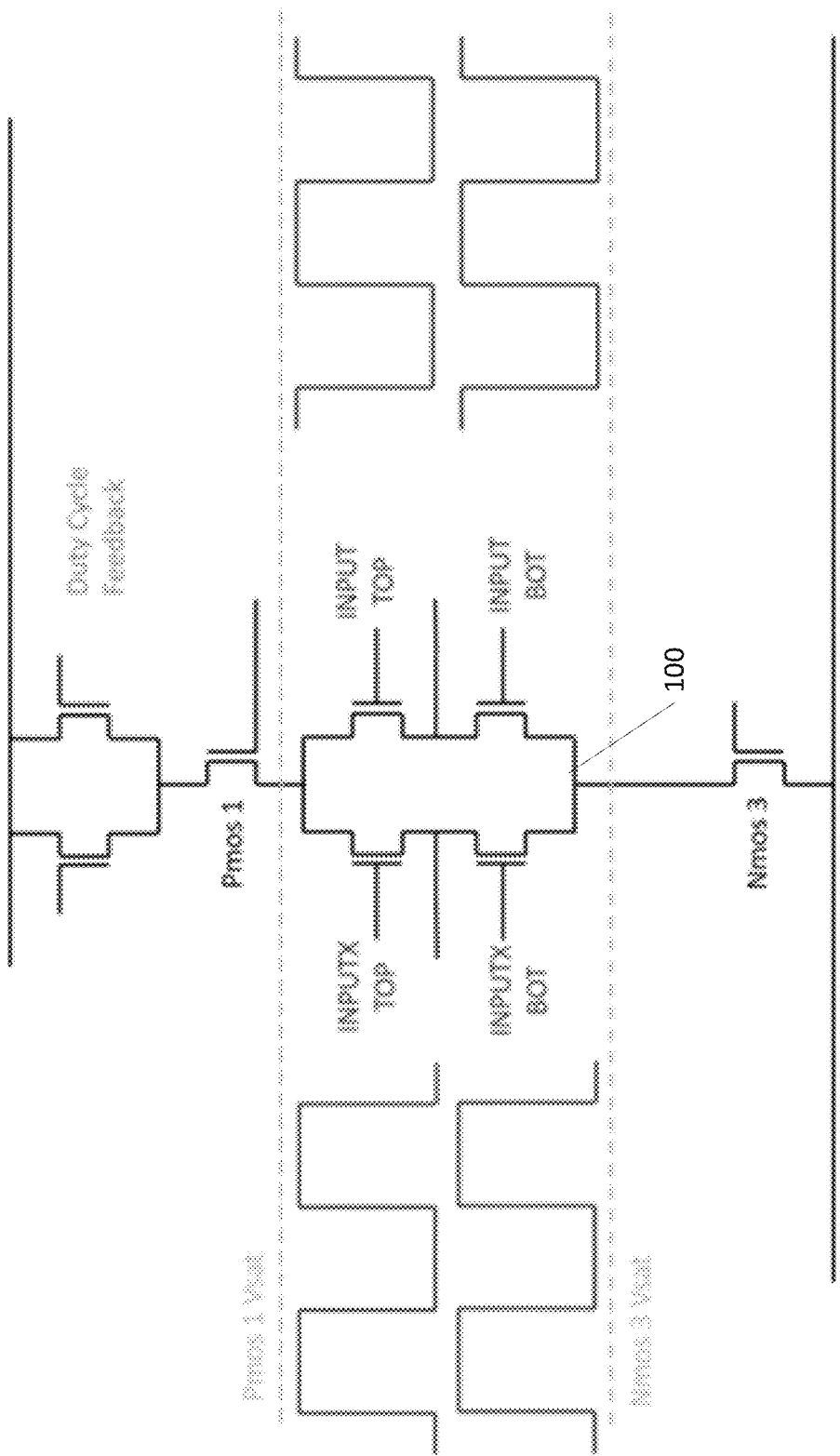
FIG. 4 is a diagram showing input biasing of input clock levels, according to an exemplary embodiment of the current disclosure.

As shown in the exemplary embodiment of FIG. 4, a diagram shows input biasing of input clock signals. FIG. 4 illustrates a portion of a transistor-level diagram of the PI quadrant circuit (e.g., of FIG. 2) as well as representative waveforms for the two input clock signals, 'INPUT' and 'INPUT X.' As shown in FIG. 4, each clock signal is duplicated into 'TOP' and 'BOT' nodes, i.e. the signal at the 'INPUT TOP' node is identical to the signal at the 'INPUT BOT' node. In various embodiments, the biasing of input clock signals is important to the operation of the integrated circuit. Input levels of clock signals may be set such that neither 'PMOS 1' or 'NMOS 3' are out of saturation.

Figure 5:
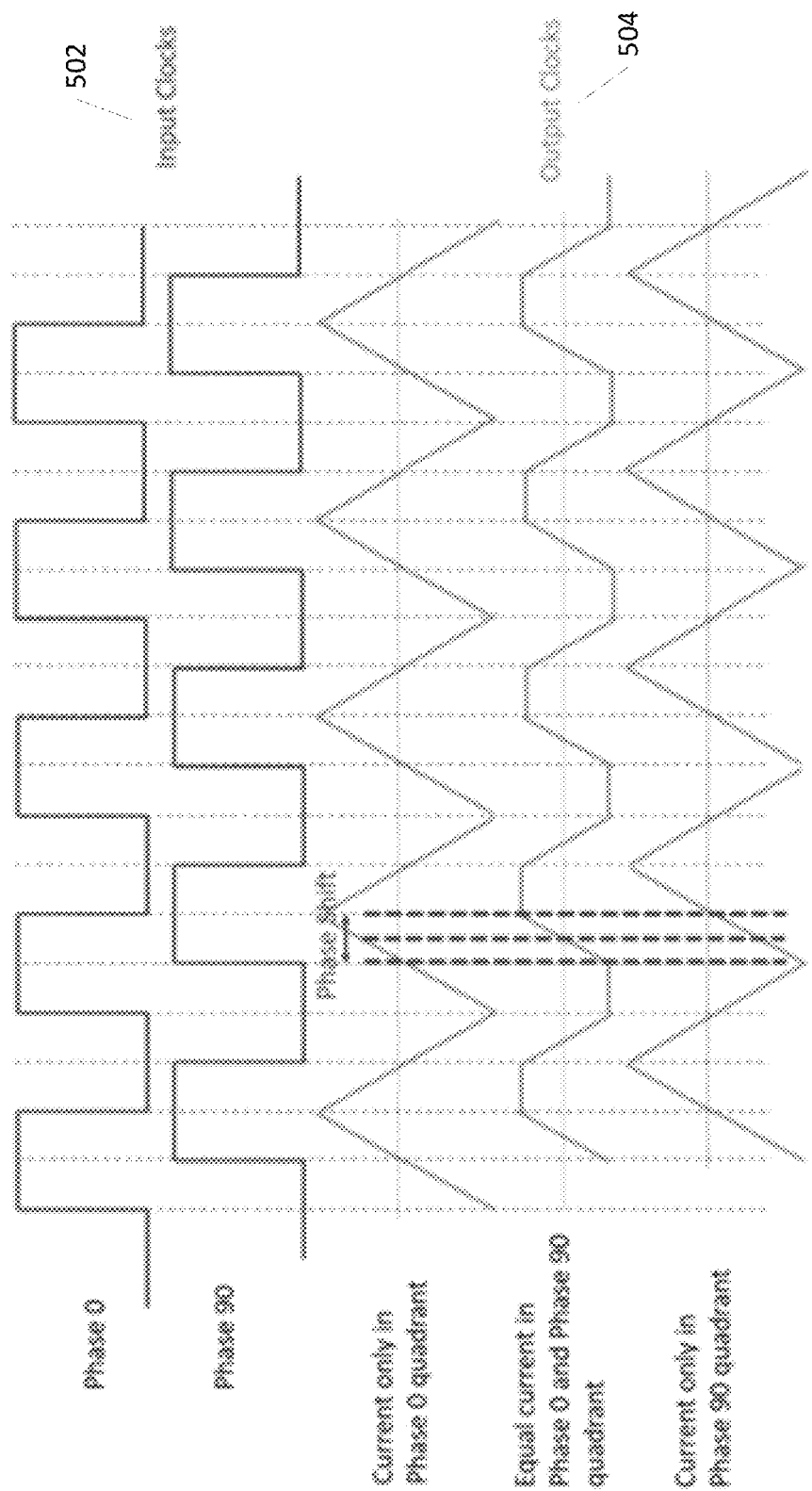
FIG. 5 is a diagram showing input clock signal waveforms and output clock signal waveforms during operation of a four-quadrant phase interpolator circuit, according to an exemplary embodiment of the current disclosure.

As shown in the exemplary embodiment of FIG. 5, the diagram shows input clock signal waveforms 502 and output clock signal waveforms 504 during operation of a four-quadrant PI circuit, according to an exemplary embodiment of the current disclosure. Specifically, FIG. 5 illustrates square-wave input clock signals and output waveforms generated by a PI quadrant circuit. In various embodiments, phase interpolation may occur as current shifts between phase interpolator quadrant circuits. In many embodiments, when all current is operating in a 0 degree phase quadrant, a ramp may be generated at a fixed edge rate determined by a load capacitance and a bias current. In certain embodiments, for example, the embodiment shown in FIG. 5, when a current is split between a 0 degree phase quadrant and a 90 degree phase quadrant, there may be two possible modes of operation, depending on which part of a cycle the device is operating at. In some embodiments, when a clock signal at a 0 degree phase quadrant and a 90 degree phase quadrant are both set to a same state (e.g., such that bridges in each quadrant are set to a same condition), a fixed edge rate may continue.

In certain embodiments, for example, at points where quadrants may have different states and where a switching bridge may be set to a different polarity, an output may stay at a static position, as each bridge may be pulling an output in opposite directions. In some embodiments, as a current may be shifted completely over to a 90 degree phase quadrant, a full swing may be returned. However, in such embodiments, a clock may then be shifted over to a 90 degree phase. In most embodiments, when considering a midpoint of an output signal, as a current is shifted from a 0 degree phase quadrant to a 90 degree phase quadrant, the midpoint shifts proportionally to a current shifted from a 0 degree phase to the 90 degree phase. This shift may allow any phase to be generated, where the shift may be proportional to the current shift. In some embodiments, shifting current through each quadrant may cause an output clock signal to be shifted through 360 degrees.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112 (f). Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. A system comprising:
    a source generating four input clock signals;
    a phase interpolator (PI) circuit comprising four PI quadrant circuits and a PI bias control circuit,
        wherein each PI quadrant circuit is configured to:
            receive, via the source, an input clock signal of the four input clock signals, and
            generate, based on the input clock signal, a pair of intermediate output clock signals of complementary phases;
    a feedback loop linking a final output clock signal to the four PI quadrant circuits; and
    a current mode logic (CML) to complementary metal-oxide semiconductor (CMOS) converter, wherein the CML to CMOS converter generates, based on respective pairs of intermediate output clock signals received from the four PI quadrant circuits, the final output clock signal.

2. The system of claim 1,
    wherein the PI bias control circuit is configured to apply a bias to one or more of the four PI quadrant circuits to adjust a phase of one or more intermediate output clock signals of the pairs of intermediate output clock signals.

3. The system of claim 1, wherein the feedback loop causes the final output clock signal to set a common mode for the four PI quadrant circuits, wherein the source is s single current source.

4. The system of claim 1, wherein the feedback loop causes the final output clock signal to correct a duty cycle of at least one intermediate output clock signal of the pairs of intermediate output clock signals.

5. The system of claim 1, wherein the feedback loop causes the final output clock signal to correct an inaccuracy in a duty cycle of at least one input clock signal of the four input clock signals.

6. The system of claim 1, wherein the PI bias control circuit is further configured to adjust a phase of one or more of the intermediate output clock signals in one or more sub-picosecond steps.

7. The system of claim 1, wherein the PI bias control circuit is further configured to adjust the phase of one or more of the intermediate output clock signals by a binary word input.

8. The system of claim 1, wherein each of the four PI quadrant circuits is a class B device.

9. A method for low power phase interpolation with duty cycle correction, the method comprising:
    generating four input clock signals for a phase interpolator (PI) circuit in an integrated circuit, wherein the PI circuit comprises four PI quadrant circuits and a PI bias control circuit, wherein the four PI quadrant circuits receive the four input clock signals respectively;
    generating, for each of the four PI quadrant circuits, based on the respective input clock signal, a pair of intermediate output clock signals of complementary phases;
    generating, via a current mode logic (CML) to complementary metal-oxide-semiconductor (CMOS) converter in the integrated circuit, using pairs of intermediate output clock signals generated for the four PI quadrant circuits respectively, a final output clock signal;
    outputting the final output clock signal; and
    setting, using the final output clock signal, a common mode for the four PI quadrant circuits.

10. The method of claim 9, further comprising:
    applying, via the PI bias control circuit, a bias to one or more of the four PI quadrant circuits.

11. The method of claim 10, wherein the bias adjusts a phase of one or more intermediate output clock signals of the pairs of intermediate output clock signals in one or more sub-picosecond steps.

12. The method of claim 10, wherein the bias adjusts a phase of one or more intermediate output clock signals of the pairs of intermediate output clock signals by a binary word input.

13. The method of claim 9, further comprising:
    causing, using the final output clock signal and via one or more of the four PI quadrant circuits, a correction of a duty cycle of at least one intermediate output clock signal of the pairs of intermediate output clock signals.

14. The method of claim 9, further comprising:
    causing, using the final output clock signal, a correction of an inaccuracy in a duty cycle of at least one input clock signal of the four input clock signals.

15. A system comprising:
    a source generating four input clock signals;
    a phase interpolator (PI) circuit comprising eight PI quadrant circuits and a PI bias control circuit,
        wherein each PI quadrant circuit is configured to:

receive, via the source, a respective input clock signal of the four input clock signals, and generate, based on the respective input clock signal, a pair of intermediate output clock signals of complementary phases; and a current mode logic (CML) to complementary metal-oxide-semiconductor (CMOS) converter, wherein the CML to CMOS converter generates, based on the pairs of intermediate output clock signals received from the eight PI quadrant circuits, a final output clock signal.

16. The system of claim 15, wherein the CML to CMOS converter generates the final output clock signal by:

combining each pair of the pairs of intermediate output clock signals received from the eight PI quadrant circuits to result in four output clock signals; and generating, based on the four output clock signals, the final output clock signal.

17. The system of claim 15, wherein the PI bias control applies a bias to one or more of the eight PI quadrant circuits to adjust a phase of one or more of the intermediate output clock signals.

18. The system of claim 15, further comprising:

a feedback loop linking the final output clock signal to the eight PI quadrant circuits, wherein the feedback loop causes the final output clock signal to correct a duty cycle of one or more of the intermediate output clock signals, wherein the source is a current source.

19. The system of claim 15, wherein each of the eight PI quadrant circuits is a class B device.

* * * * *